(12) United States Patent
Gupta et al.

(10) Patent No.: US 11,900,987 B2
(45) Date of Patent: Feb. 13, 2024

(54) NON-VOLATILE STATIC RANDOM ACCESS MEMORY WITH INDEPENDENTLY ACCESSIBLE NON-VOLATILE BIT CELL AND METHOD OF OPERATING THE SAME

(71) Applicants: IMEC vzw, Leuven (BE); Katholieke Universiteit Leuven, Leuven (BE)

(72) Inventors: Mohit Gupta, Heverlee (BE); Manu Komalan Perumkunnil, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 16/951,919

(22) Filed: Nov. 18, 2020

(65) Prior Publication Data
US 2021/0158859 A1    May 27, 2021

(30) Foreign Application Priority Data
Nov. 22, 2019   (EP) ..................... 19210885

(51) Int. Cl.
G11C 7/12       (2006.01)
G11C 11/4094    (2006.01)
G11C 5/06       (2006.01)
G11C 11/4074    (2006.01)
G11C 14/00      (2006.01)

(52) U.S. Cl.
CPC ............ *G11C 11/4094* (2013.01); *G11C 5/06* (2013.01); *G11C 11/4074* (2013.01); *G11C 14/009* (2013.01); *G11C 14/0054* (2013.01); *G11C 14/0081* (2013.01)

(58) Field of Classification Search
CPC ............ G11C 14/0054; G11C 14/0081; G11C 14/009
See application file for complete search history.

(56) References Cited

U.S. PATENT DOCUMENTS

| | | | |
|---|---|---|---|
| 7,796,417 B1 * | 9/2010 | Lewis ................ | G11C 13/0004 365/148 |
| 9,437,298 B1 | 9/2016 | Tomishima et al. | |
| 9,514,816 B1 * | 12/2016 | Ashokkumar ..... | G11C 14/0072 |
| 9,640,256 B1 * | 5/2017 | Roy ....................... | H10B 10/12 |

(Continued)

FOREIGN PATENT DOCUMENTS

CN     107039078 A    8/2017

OTHER PUBLICATIONS

Extended European Search Report dated Jun. 15, 2020 in counterpart European Application No. 19210885.0 in 8 pages.

*Primary Examiner* — Mushfique Siddique
(74) *Attorney, Agent, or Firm* — Knobbe Martens Olson & Bear LLP

(57) ABSTRACT

The disclosed technology relates to a non-volatile (NV) static random-access memory (SRAM) device, and to a method of operating the same. The NV-SRAM device includes a plurality of bit-cells, wherein each bit-cell comprises: an SRAM bit-cell; a first bit-line connected via a first access element to the SRAM bit-cell; a NV bit-cell connected via a switch to the SRAM bit-cell; and a second bit-line connected via a second access element to the NV bit-cell. The NV-SRAM device is configured to independently write data from the first bit-line into the SRAM bit-cell through the first access element, and respectively from the second bit-line into the NV bit-cell through the second access element.

17 Claims, 7 Drawing Sheets

(56) References Cited

U.S. PATENT DOCUMENTS

| | | | |
|---|---|---|---|
| 9,823,874 B2* | 11/2017 | Sadd | G11C 11/005 |
| 2005/0073876 A1 | 4/2005 | Chen et al. | |
| 2005/0185441 A1 | 8/2005 | Chen et al. | |
| 2012/0020159 A1 | 1/2012 | Ong | |
| 2016/0351257 A1 | 12/2016 | Wu et al. | |
| 2019/0013063 A1 | 1/2019 | Liu et al. | |
| 2019/0013076 A1* | 1/2019 | Kanda | G11C 11/412 |
| 2019/0244666 A1* | 8/2019 | Hsu | G11C 14/009 |

* cited by examiner

NON-VOLATILE STATIC RANDOM ACCESS MEMORY WITH INDEPENDENTLY ACCESSIBLE NON-VOLATILE BIT CELL AND METHOD OF OPERATING THE SAME

CROSS-REFERENCE TO RELATED APPLICATIONS

This application claims foreign priority to European Application No. EP 19210885.0, filed on Nov. 22, 2019, the content of which is incorporated by reference herein in its entirety.

BACKGROUND

Field

The disclosed technology relates generally to semiconductor memory devices, and more particularly to a non-volatile (NV) static random-access memory (SRAM) device, and to a method of operating the NV-SRAM device.

Description of the Related Technology

NV-SRAM devices provide non-volatility storage functionality in addition to memory functionality of SRAM devices. This is achieved by adding a NV bit-cell to each SRAM bit-cell of an SRAM device, in order to form the bit-cells of the resulting NV-SRAM device. Information stored into the SRAM bit-cells is also stored into the NV bit-cells, but in a non-volatile manner.

NV-SRAM devices are, for instance, useful for internet of things (IOT) applications, in particular, for shutting down an IOT application or for lowering its supply voltage to ground.

However, the additional NV bit-cells increase the area of each bit-cell by around 3-4 times compared to a bit-cell of a conventional SRAM device (i.e., the bit-cell being the SRAM bit-cell). This is further promoted by the write current requirements that need to be met. In addition, extra transistors used for the selection of the NV-bit cells increase the area of each bit-cell of the NV-SRAM device even more.

Furthermore, suitable NV memory elements for the NV bit-cell of a NV-SRAM device, e.g., resistive memory elements, typically require a write current in the range of >100 µA. Consequently, writing the whole NV-SRAM device will require quite a lot of current, which can create thermal issues.

SUMMARY OF CERTAIN INVENTIVE ASPECTS

In view of the above-mentioned disadvantages, embodiments of the present invention aim to provide an improved NV-SRAM device and an improved method of operating such a NV-SRAM device. An objective is in particular to provide a NV-SRAM device, which has a small form factor and a reduced size compared to a conventional NV-SRAM devices. To this end, an area needed for each bit-cell should be designed to be smaller than in a conventional NV-SRAM device. Further, a write operation into the NV-SRAM device should not require an excessive amount of current, and should work with less current than a conventional NV-SRAM device, so that thermal issues are avoided.

To address these and other needs, a NV-SRAM device according to embodiments includes one or more SRAM bit-cells, which are connected to one or more NV bit-cells. In particular, each NV bit-cell may comprise a resistive memory element and/or a voltage-controlled magnetic anisotropy (VCMA) memory element.

The objective is achieved by the embodiments of the invention provided in the enclosed independent claims. Advantageous implementations of these embodiments are defined in the dependent claims.

In a first aspect, a NV-SRAM device includes a plurality of bit-cells, wherein each bit-cell comprises: an SRAM bit-cell, a first bit-line connected via a first access element to the SRAM bit-cell, a NV bit-cell connected via a switch to the SRAM bit-cell, and a second bit-line connected via a second access element to the NV bit-cell. The NV-SRAM device is configured to independently write data from the first bit-line into the SRAM bit-cell through the first access element, and from the second bit-line into the NV bit-cell through the second access element.

The NV-SRAM device of the first aspect can be built having a very compact form factor, and provide a significant area benefit over conventional NV-SRAM devices. This is, for instance, achieved by not writing into the NV bit-cell(s) through the first access element(s) (or specifically through access transistors for SRAM bit-cells, or SRAM transistors, as in a conventional NV-SRAM device). Both the SRAM bit-cell and the NV-bit cell can be optimized in terms of their size. Notably, the SRAM bit-cell may be the same size than the bit-cell in a conventional SRAM device, but the NV bit-cell may be designed much smaller than in a conventional NV-SRAM device.

Furthermore, writing into the NV bit-cell of the NV-SRAM device of the first aspect does not disturb the data stored in the SRAM bit-cell, which could happen, if the first access element(s) (or specifically the access transistors for SRAM bit-cells, or SRAM transistors, in a conventional NV-SRAM device) would be used for writing into the NV bit-cell. The NV-SRAM device of the first aspect can further operate with a very low power SRAM supply voltage, and thus also avoids thermal issues.

The NV-SRAM device of the first aspect is useful, for instance, for IOT sensor systems, as well as for automotive applications.

In an implementation, the NV-SRAM device is further configured to read data from the NV bit-cell into the SRAM bit-cell through the enabled switch.

That means, the switch is opened or enabled, in order to allow current to flow through. In this way, the data in the SRAM bit cell(s) can be restored from the NV bit-cell(s).

In an implementation of the NV-SRAM device, the NV bit-cell comprises a resistive memory element.

In an implementation of the NV-SRAM device, the resistive memory element comprises a spin-transfer-torque magnetoresistive random access memory (STT-MRAM) element, a resistive random access memory (RRAM) element or a phase-change random access memory (PC-RAM) element.

In an implementation of the NV-SRAM device, the second access element comprises a transistor.

In an implementation of the NV-SRAM device, the NV bit-cell comprises a (VCMA) memory element.

In an implementation of the NV-SRAM device, the VCMA memory element comprises a magnetic tunnel junction (MTJ) memory element.

The MTJ may comprise, for example, a magnetic free layer, a magnetic reference layer, and a tunnel barrier in between these layers. Further, the VCMA memory element may comprise a first electrode connected to the magnetic reference layer, and a second electrode connected to the magnetic free layer. Information can be stored in the magnetic free layer, depending on a tunnel resistance from the magnetic reference layer (fixed magnetic layer) into the magnetic free layer. Depending on the magnetic anisotropy in the magnetic free layer, the resistance across the MTJ is higher or lower. The magnetic anisotropy can be changed by applying certain voltage to the second electrode. The tunnel resistance can be determined using the first and second electrode.

In an implementation of the NV-SRAM device, the second access element comprises a diode.

By using a VCMA memory element, it is possible to use a diode as second access element, instead of, e.g., a transistor. This is possible because of the single-side writing of the VCMA memory element. As a consequence, the area of the NV-SRAM device can be reduced further.

In an implementation of the NV-SRAM device, the switch is connected between the first access element and the second access element.

In an implementation of the NV-SRAM device, the first access element comprises a transistor, and/or the second access element comprises a transistor, and/or the switch comprises a transistor.

In an implementation of the NV-SRAM device, a gate of the transistor comprised by the first access element is connected to a first word-line, and/or a gate of the transistor comprised by the second access element is connected to a second word-line, and/or a gate of the transistor comprised by the switch is connected to a first restore-line, and/or the non-volatile bit-cell is connected to a second restore-line.

A second aspect of the disclosure relates to a method of operating a NV-SRAM device according to the first aspect or any of its implementations, wherein the method comprises, for writing into the NV bit-cell: reading data from the SRAM bit-cell to the first bit-line through the first access element, and writing the data from the second bit-line into the NV bit-cell through the second access element.

That means, in the method of the second aspect, writing into the NV bit-cell includes two cycles (e.g., two clock cycles) or two phases (e.g., phases within one clock cycle). Namely, a first cycle/phase of reading from the SRAM bit-cell, and a second cycle/phase of writing into the NV bit-cell.

The writing into the NV bit-cell does not disturb the data in the SRAM bit cell, since the writing does not need to enable the first access element.

In an implementation of the method, for the writing into the NV bit-cell, the reading of the data from the SRAM bit-cell and the writing of the data into the NV bit-cell, respectively, is performed one after the other in the same clock cycle.

Accordingly, two phases can happen in a single clock cycle one after the other, as the reading current is much less than the write current.

In an implementation of the method, writing into a plurality of NV bit-cells is performed word-line by word-line.

In an implementation, the method further comprises, for reading data from the non-volatile bit-cell into the SRAM bit-cell: enabling the switch between the NV bit-cell and the SRAM bit-cell, and ramping-up a restore voltage applied to the nonvolatile bit-cell or ramping-up a supply voltage applied to the SRAM bit-cell.

In this way, data can be easily restored from the NV bit-cell into the SRAM bit-cell, if necessary.

BRIEF DESCRIPTION OF THE DRAWINGS

The above described aspects and implementations are explained in the following description of embodiments with respect to the enclosed drawings.

DETAILED DESCRIPTION OF CERTAIN ILLUSTRATIVE EMBODIMENTS

Figure 1:
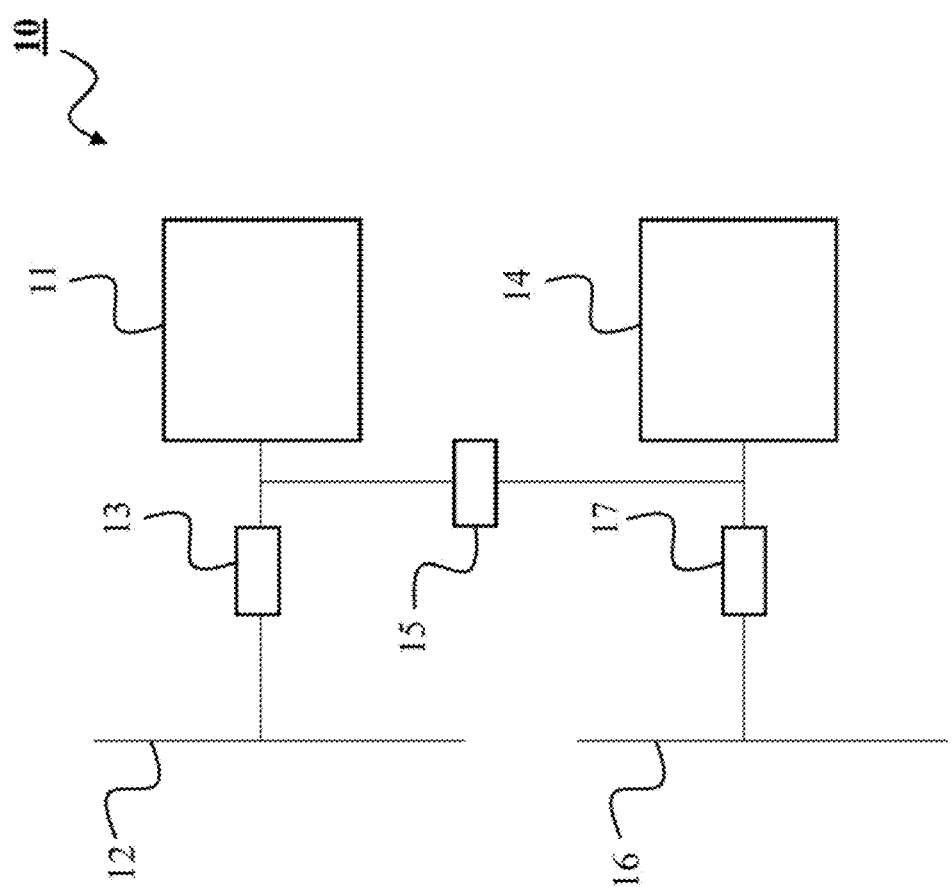
FIG. 1 shows schematically a NV-SRAM device, according to an embodiment.

FIG. 1 shows a NV-SRAM device 10 according to an embodiment of the disclosure. The NV-SRAM device 10 comprises a plurality of bit-cells, which are configured to store data. Each bit-cell comprises an SRAM bit-cell 11, which is connected to a NV bit-cell 14. Accordingly, the NV-SRAM device 10 comprises a plurality of SRAM bit-cells 11 connected, in particular connected one-by-one, to a plurality of NV bit-cells 14. Each NV bit-cell 14 is thereby connected via at least one switch 15 to the corresponding SRAM bit-cell 11.

Each SRAM bit-cell 11 can be designed similar to a SRAM bit-cell in a conventional SRAM device, in particular, with respect to multiple storage nodes per SRAM bit-cell. Each NV bit-cell 14 may comprise at least one resistive memory element and/or at least one VCMA memory element. In particular, each NV bit-cell 14 may comprise at least one STT-MRAM element, at least one RRAM element, or at least one PC-RAM element.

Each SRAM bit-cell 11 is connected to at least one first bit-line 12 via/through at least one first access element 13. Each NV bit-cell 14 is connected to at least one second bit-line 16 via/through at least one second access element 17. For instance, the first access element 13 and/or the second access element 17 may each comprise a transistor. The transistors that serve as access first and second elements 13, 17 for the SRAM bit cell 11 and the NV bit-cell 14 may be referred to herein as SRAM transistors and/or NV transistors, respectively.

The NV-SRAM device 10 of FIG. 1 is configured to write data from the at least one first bit-line 12 into the SRAM bit-cell 11, in particular through the at least one first access element 13. Further, the NV-SRAM device 10 is configured to, independently from writing of the data into the SRAM bit-cell 11, write data from the at least one second bit-line 16 into the non-volatile bit-cell 14, in particular through the at least one second access element 17.

Furthermore, the NV-SRAM device 10 is configured to read data from the NV bit-cell 14, and to write that (previously read) data directly into the SRAM bit-cell 11, in particular through the at least one switch 15, where the at least one switch 15 is activated or enabled or opened.

Figure 2:
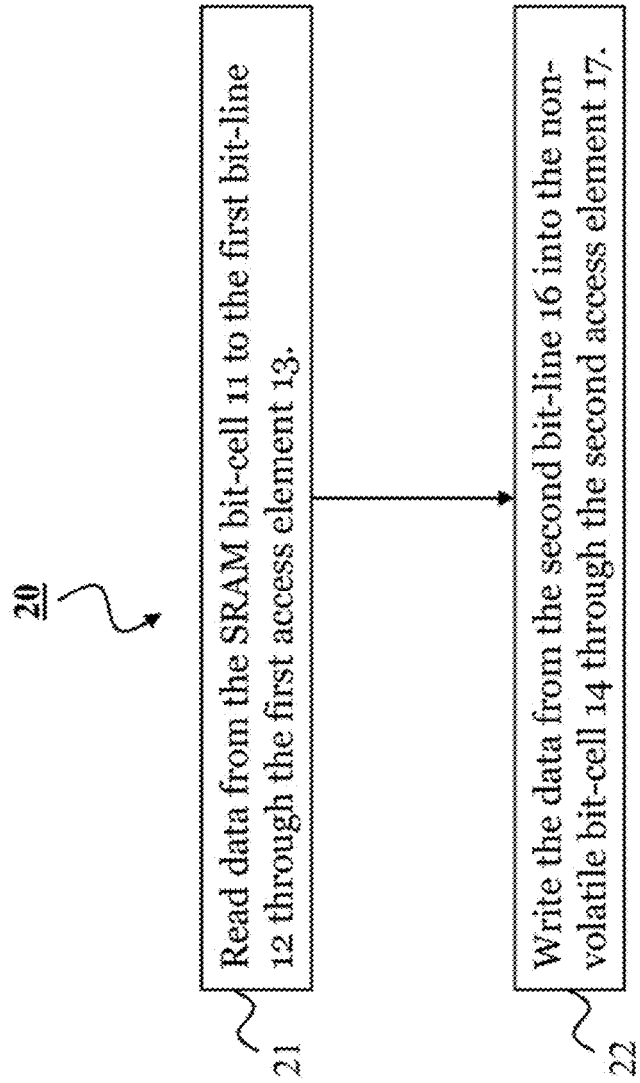
FIG. 2 shows schematically a method of operating a NV-SRAM device, according to an embodiment.

FIG. 2 shows a method 20 according to an embodiment of the disclosure, which corresponds to the NV-SRAM device 10 shown in FIG. 1. In particular, the method 20 is suitable for operating the NV-SRAM device 10 of FIG. 1. The method 20 comprises writing into the NV bit-cell 14, and includes to this end: a step 21 of reading data from the SRAM bit-cell 11 to the first bit-line 12 through the first access element 13; and a step 22 of writing the data from the second bit-line 16 into the NV bit-cell 14 through the second access element 17.

Figure 3:
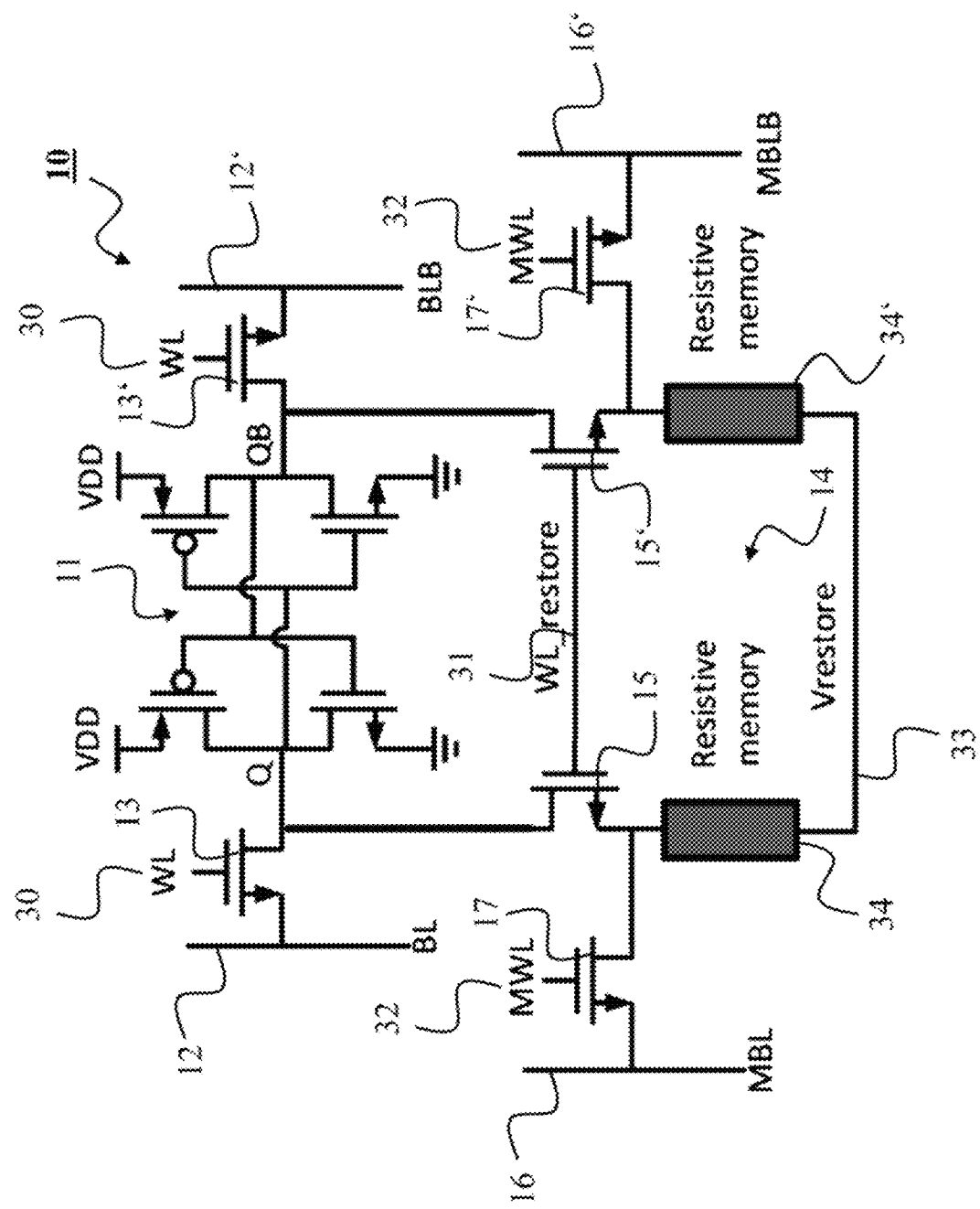
FIG. 3 shows a NV-SRAM device according to an embodiment, which includes resistive memory elements in the NV bit-cell.

FIG. 3 shows the NV-SRAM device 10 according to an exemplary embodiment of the disclosure, which illustrates particular implementations of some elements of the embodiment shown in FIG. 1. In particular, the NV-SRAM device 10 shown in FIG. 3 includes the elements shown in FIG. 1, and includes additional elements. Same elements in FIG. 1 and FIG. 3 are accordingly labelled with the same reference signs and function likewise. Notably, in this document, two elements that are respectively labelled with reference signs "X" and "X"' (as, e.g., in FIG. 3, respectively, the first access elements "13" and "13"') may be implemented and function likewise.

The NV-SRAM device 10 of FIG. 3 includes the NV bit-cell 14, which comprises two resistive memory elements 34 and 34'. One resistive memory element 34 is connected via the second access element 17, here in particular implemented as a transistor, to the second bit-line 16 (MBL)). The other resistive memory element 34' is likewise connected via another second access element 17', here in particular implemented as a transistor, to another second bit-line 16' (MBLB). The two resistive memory elements 34 and 34' may be connected together via a restore-line 33.

The SRAM bit-cell 11 comprises two storage nodes, Q and QB, wherein the storage nodes can be designed as in a conventional SRAM bit-cell. In particular, as shown in FIG. 3, each SRAM bit-cell 11 may be made up of four storage transistors storing an information bit, wherein the four storage transistors form two cross-coupled inverters. The storage node Q (associated with two transistors) is connected via the first access element 13, in particular implemented as a transistor, to the first bit-line 12 (BL). The storage node QB (associated with two storage transistors) is likewise connected via another first access element 13', here in particular implemented as a transistor, to another first bit-line 12' (BLB).

The one resistive memory element 34 is associated with the storage node Q, and the other resistive memory element 34' is associated with the storage node QB. The switch 15, here in particular implemented as a transistor, connects the storage node Q and the resistive element 34. Likewise, another switch 15', here in particular implemented as a transistor, connects the storage node QB and the other resistive memory element 34'. The switch 15 is connected between the first access element 13 and the second access element 17, and the other switch 15' is connected between the other first access element 13' and the other second access element 17'.

The switches 15 and 15' may be connected together by a restore line 31. In particular, gates of transistors implementing the switches 15 and 15', may be connected to/by the restore-line 31. Further, gates of the transistors implementing the first access elements 13 and 13' are connected to a first word-line 32 (WL), and gates of the transistors implementing the second access elements 17 and 17' are connected to a second word-line 32 (MWL).

In the NV-SRAM device 10 shown in FIG. 3 (also valid for the device in FIG. 1, but FIG. 3 is used in the following for explanation), writing may be carried out in two cycles (e.g., two clock cycles), or in two phases (e.g., two phases within one clock-cycle). In the first cycle/phase, reading of data from the SRAM bit-cell 11 is performed, and then writing of this data into the NV bit-cell 14 is performed using the first access elements 17 and 17'. The writing may occur row by row, i.e., word-line by word-line. A read energy required for reading the SRAM bit-cell 11 is much less than a write energy required for writing the NV bit-cell 14. For the reading of the data from the SRAM bit-cell 11 and, respectively, for the writing of this data into the NV bit-cell 14, one or more peripheral circuits, e.g., decoders, may be reused/shared (i.e., used for both operations), thus reducing the area required in total for each bit-cell (including SRAM bit-cell 11 and NV bit-cell 14) of the NV-SRAM device 10.

Figure 4:
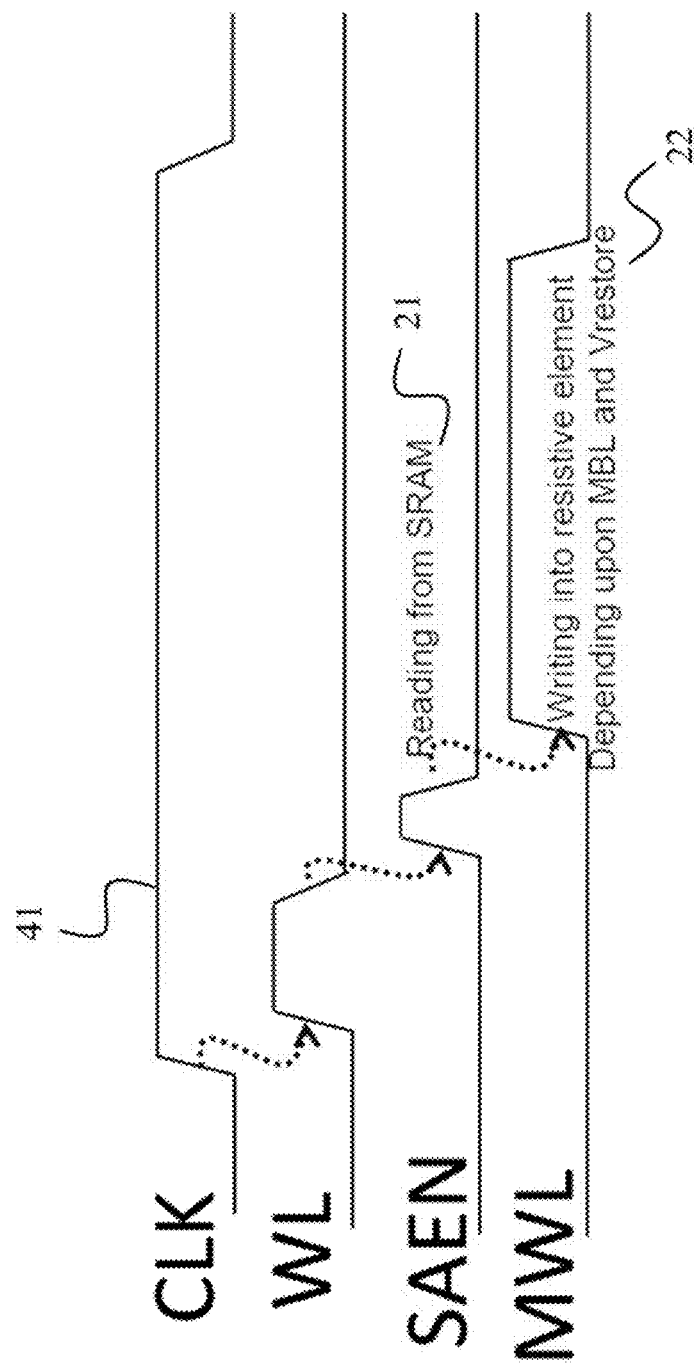
FIG. 4 shows signals used during writing into a NV bit-cell of the NV-SRAM device, according to an embodiment.

FIG. 4 shows various signals that are used when carrying out a write into the NV bit-cell 14 of the NV-SRAM device shown in FIG. 3. The signal CLK indicates the clock cycle. Here, as an example, the read from the NV-SRAM bit-cell 11 and the write into the NV bit-cell 14 happen in two phases after another within one clock cycle. The signal WL indicates a signal on the word-line 30, which enables/opens the first access elements 13 and 13', in order to read data from the NV bit-cell 11, in particular from the storage nodes Q and QB, to the first bit-lines 12 and 12', respectively. The signal SAEN (sense amplified enable) indicates the activation of one or more sense amplifiers, in order to determine the data read to the bit-lines 12 and 12'. The signal MWL indicates a signal on the word-line 32, which enables/opens the second access elements 17 and 17', in order to write the data from the second bit-lines 16 and 16' (transferred thereto from the first bit-lines 12 and 12', respectively) to the NV bit-cell 14, in particular into the resistive memory elements 34 and 34'.

Figure 5:
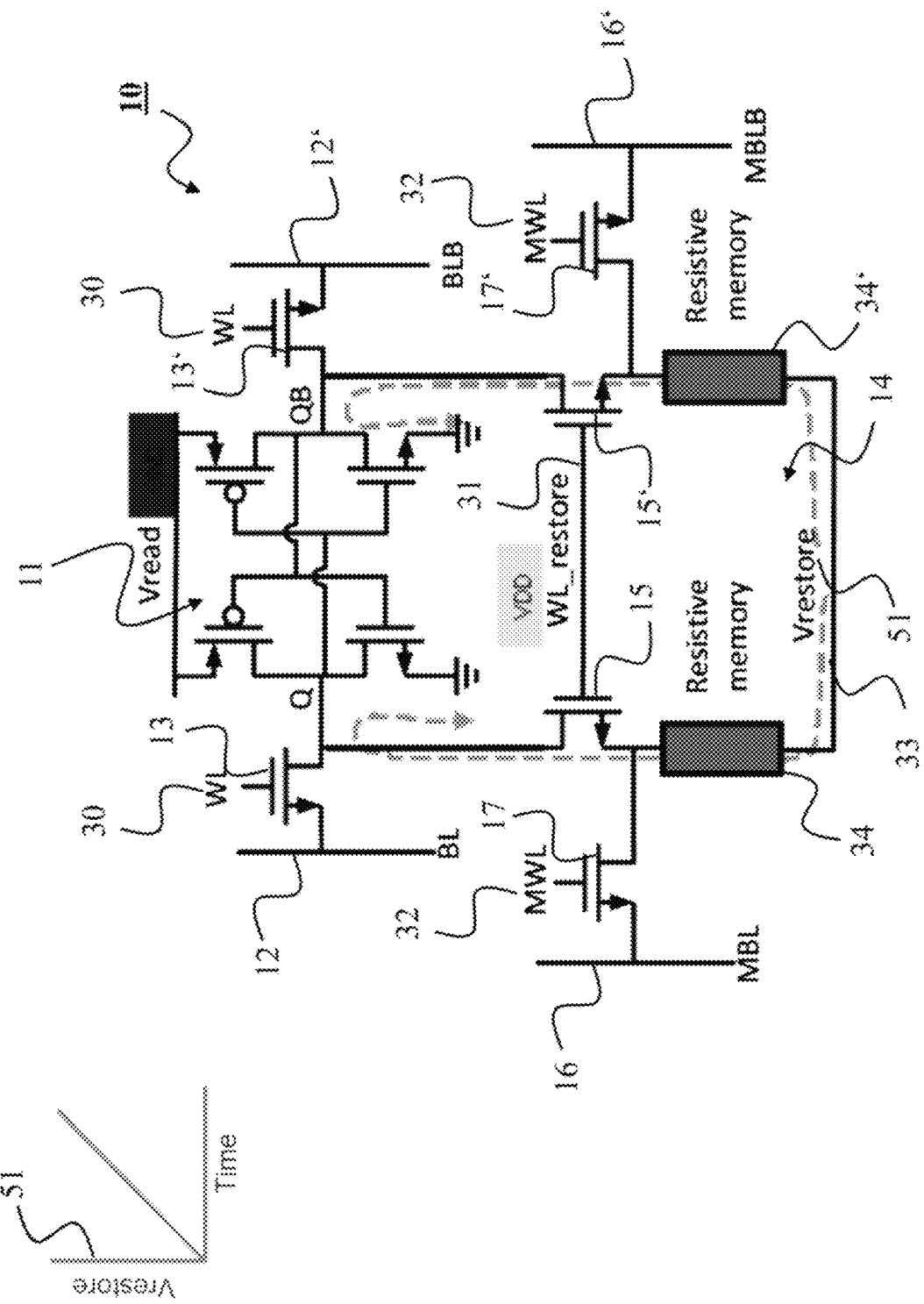
FIG. 5 shows a first mechanism of writing into the SRAM bit-cell from the NV bit-cell in a NV-SRAM device, according to an embodiment.

FIG. 5 shows a first mechanism of writing into the SRAM bit-cell 11 from the NV bit-cell 14, i.e., for restoring data from the NV bit-cell 14. In particular, for reading data from the NV bit-cell 14 into the SRAM bit-cell 11, the switches 15 and 15' are enabled/opened. Further, a restore voltage 51, which is applied to the NV bit-cell 14, in particular, is applied to the restore-line 33, is ramped-up, for instance, linearly. The paths, over which the data is consequently written into the SRAM bit-cell 11, are indicated by the dashed lines in FIG. 5.

Figure 6:
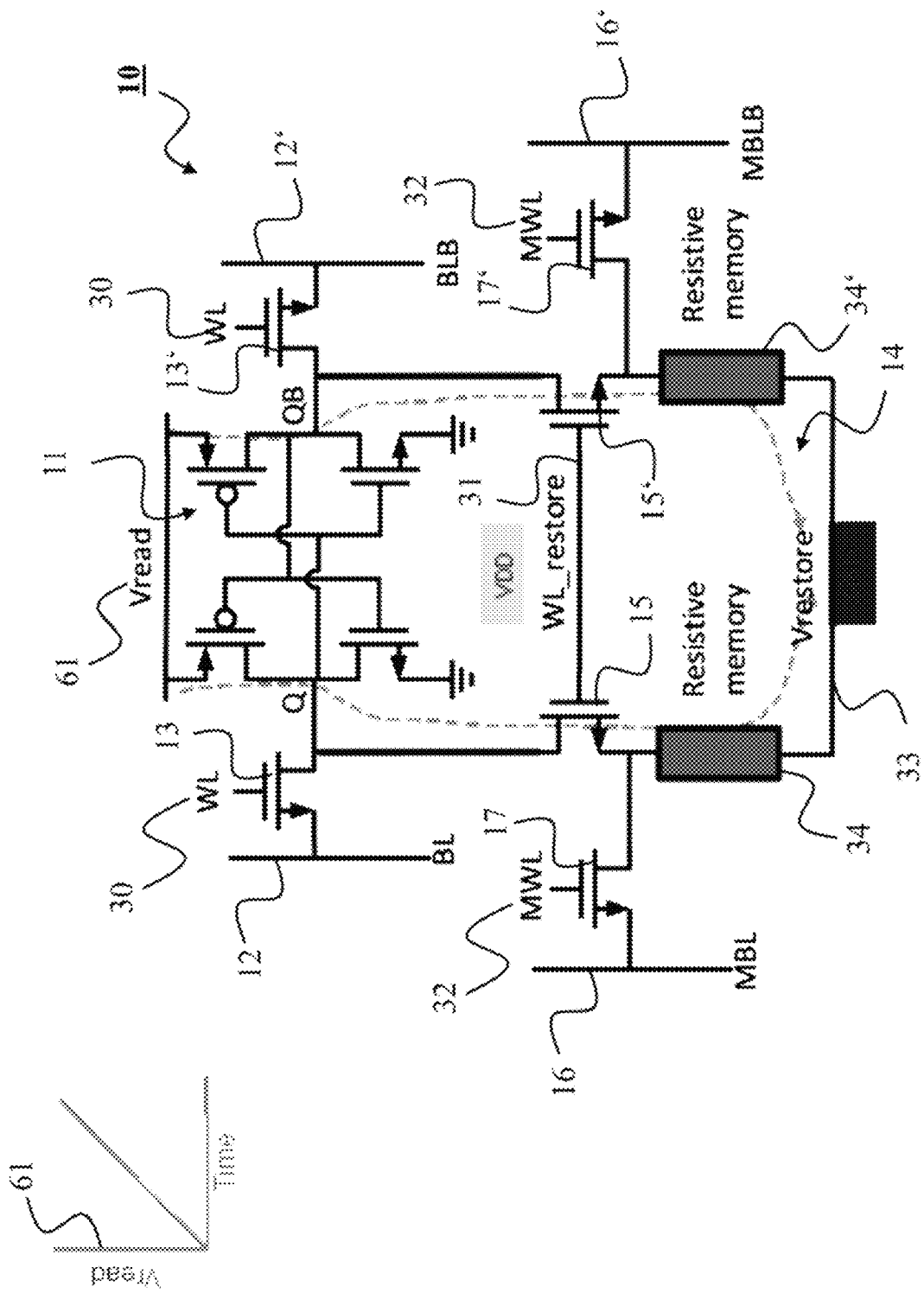
FIG. 6 shows a second mechanism of writing into the SRAM bit-cell from the NV bit-cell, in a NV-SRAM device according to an embodiment.

FIG. 6 shows a second mechanism of writing into the SRAM bit-cell 11 from the NV bit-cell 14, i.e., for restoring data from the NV bit-cell 14. In particular, for reading data from the NV bit-cell 14 into the SRAM bit-cell 11, the switches 15 and 15' are enabled/opened. Further, a supply voltage 61, which is applied to the SRAM bit-cell 11, in particular is applied to both storage nodes Q and QB, is ramped-up, for instance, linearly. The paths, over which the data is consequently written into the SRAM bit-cell 11, are indicated by the dashed lines in FIG. 6.

Figure 7:
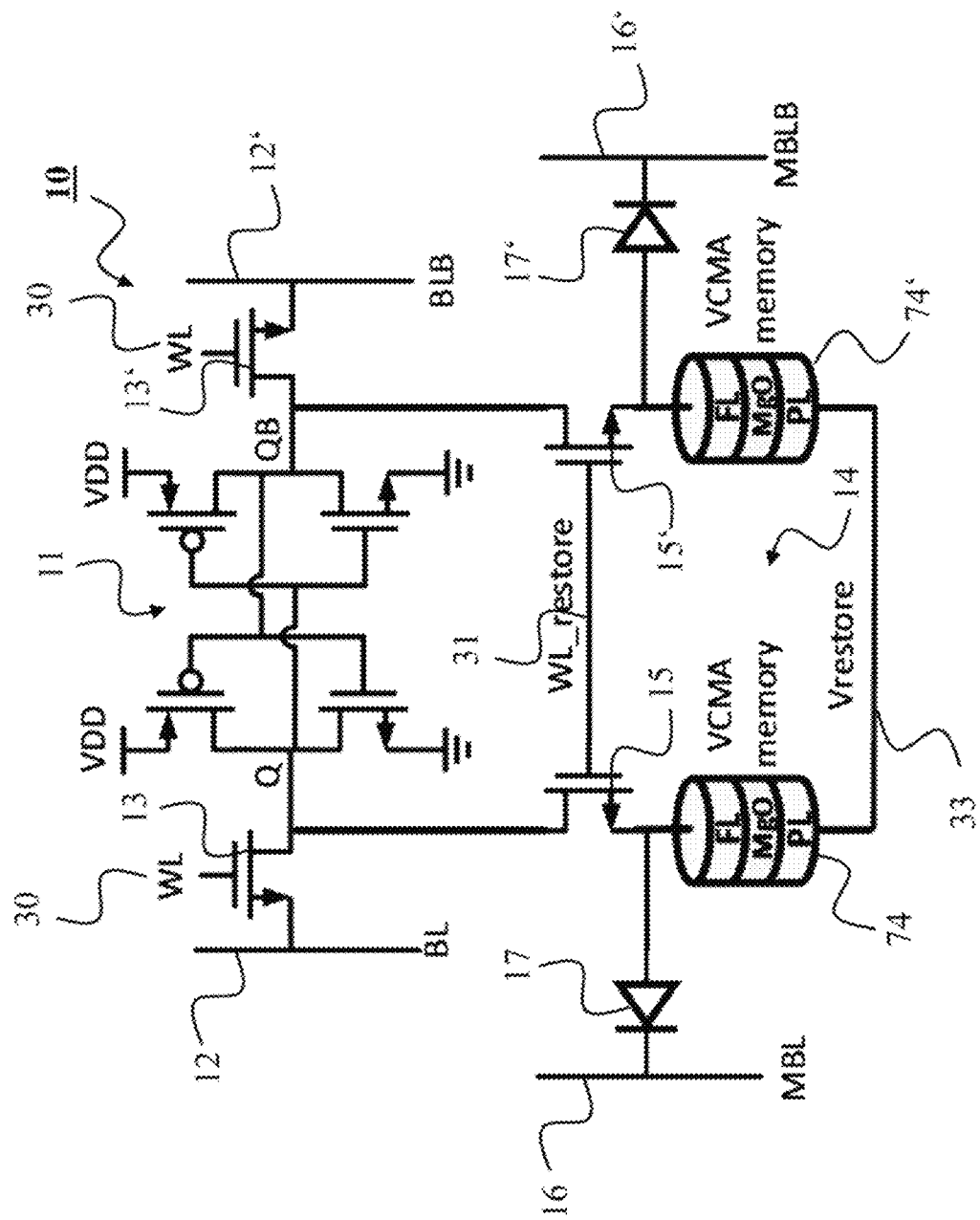
FIG. 7 shows a NV-SRAM device according to an embodiment, which includes VCMA memory elements in the NV bit-cell.

FIG. 7 shows the NV-SRAM device 10 according to an exemplary embodiment of the disclosure, which builds on the embodiment shown in FIG. 1 and partly on the embodiment shown in FIG. 2. In particular, the NV-SRAM device 10 shown in FIG. 7 includes the elements shown in FIG. 1 and includes some, but not all, elements shown in FIG. 2. Same elements in FIG. 1 and FIG. 2 and FIG. 7 are again labelled with the same reference signs and function likewise.

In FIG. 7, instead of the resistive memory elements 34 and 34' shown in FIG. 2, the NV bit-cell 14 now includes two VCMA memory elements 74 and 74'. Each VCMA memory element 74 and 74' is exemplarily implemented by comprising a magnetic tunnel junction (MTJ) memory element (as used, e.g., for magnetic random access memory (MRAM), in particular, a stack comprising a magnetic free layer (FL), a magnetic reference/pinned layer (PL), and a tunnel barrier (e.g. MgO) between the magnetic free layer and the magnetic reference layer). Furthermore, instead of the second access elements 17 and 17' being implemented as transistors, the second access elements 17 and 17' now comprise diodes. This decreases significantly the required area for the NV bit-cell 14, and thus also of the entire bit-cell(s) of the NV-SRAM device 10.

Writing into the VCMA memory elements 74 and 74' is possible by lowering the voltage on the first bit-lines 16 and 16', and at the same time disabling/closing the switches 15 and 15', respectively. During a read from the NV bit-cell 14, the switches 15 and 15' are enabled/opened and the bit-lines 16 and 16 are held at the supply voltage.

In summary, the NV-SRAM device 10 and the operation method 20, according to embodiments of the disclosure, lead to a reduced bit-cell size, and thus a smaller form factor of the NV-SRAM device 10. Further, less current is needed to write into the NV-SRAM device 10, such that low power operation is enabled. Further, disturbing of information stored in the SRAM bit-cell is avoided during the NV-bit-cell write.

In the embodiments described above, apparatus, systems, and methods for NV-SRAMs are described in connection with particular embodiments. It will be understood, however, that the principles and advantages of the embodiments can be used for any other systems, apparatus, or methods with a need for NV-SRAM. In the foregoing, it will be appreciated that any feature of any one of the embodiments can be combined and/or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," "infra," "supra," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All suitable combinations and subcombinations of features of this disclosure are intended to fall within the scope of this disclosure.

What is claimed is:

1. A non-volatile static random-access memory (NV-SRAM) device including a plurality of bit-cells, each bit-cell comprising:
   an SRAM bit-cell;
   a first bit-line connected via a first access element to the SRAM bit-cell;
   a non-volatile bit-cell comprising a pair of nonvolatile memory elements connected to the SRAM bit-cell through a pair of first transistors,
   wherein the pair of first transistors are directly connected to each other through a first restore-line, and
   wherein the nonvolatile memory elements have respective first terminals connected to the pair of first transistors and respective second terminals that are electrically shorted to each other through a second restore-line; and
   a pair of second bit-lines, wherein each second bit-line is independently connected to one of the nonvolatile memory elements via a respective one of a pair of second transistors,
   wherein each of the pair of second transistors is different from the first access element and each of the pair of second bit-lines is different from the first bit-line,
   wherein each of the pair of second bit-lines is electrically connected to the SRAM bit-cell via one of the pair of second transistors in series with one of the pair of first transistors, wherein a drain of each of the pair of second transistors is directly connected to a source of a respective one of the first transistors in series therewith, and further directly connected to the first terminal of the nonvolatile memory element connected to the respective one of the first transistors, wherein the NV-SRAM device is configured to independently write data from the first bit-line into the SRAM bit-cell through the first access element, and from each second bit-line into a respective one of the nonvolatile memory elements through a respective one of the pair of second transistors, wherein writing from the each second bit-line comprises switching the respective one of the pair of second transistors by actively biasing a source thereof connected directly to the each second bit-line, and wherein actively biasing the source of the respective one of the pair of second transistors causes a drain voltage thereof that defines a voltage at the first terminal of the respective one of the nonvolatile memory elements.

2. The NV-SRAM device according to claim 1, wherein the non-volatile bit-cell comprises a resistive memory element.

3. The NV-SRAM device according to claim 2, wherein the resistive memory element comprises a spin-transfer-torque magnetoresistive random access memory (STT-MRAM) element, a resistive random access memory (RRAM) element, or a phase-change random access memory (PC-RAM) element.

4. The NV-SRAM device according to claim 1, wherein the non-volatile bit-cell comprises a voltage-controlled magnetic anisotropy (VCMA) memory element.

5. The NV-SRAM device according to claim 4, wherein the VCMA memory element comprises a magnetic tunnel junction (MTJ) memory element.

6. The NV-SRAM device according to claim 1, wherein each of the first transistors is connected between the first access element and one or both of the pair of second transistors.

7. The NV-SRAM device according to claim 1, wherein the first access element comprises a transistor.

8. The NV-SRAM device according to claim 7 wherein a source of the transistor of the first access element is connected to a source of each transistor of the pair of first transistors.

9. The NV-SRAM device according to claim 7, wherein:
the first access element comprises a transistor having a gate connected to a first word-line; and/or
one or both of the pair of second transistors comprise a transistor having a gate connected to a second word-line; and/or
each of the pair of first transistors comprises a transistor having a gate connected to the first restore-line.

10. The NV-SRAM device according to claim 1, wherein:
the SRAM bit-cell is connected to a pair of first bit-lines via a pair of first access elements; and
the pair of nonvolatile memory elements is connected via the pair of first transistors to the SRAM bit-cell.

11. The NV-SRAM device according to claim 10, wherein each of the first transistors comprises a transistor having a gate, and wherein the gates of the first transistors are electrically connected to each other.

12. The NV-SRAM device according to claim 10, wherein each of the nonvolatile memory elements comprises a resistive memory element.

13. A method of operating the NV-SRAM device according to claim 1, wherein the method comprises, for writing into the non-volatile bit-cell:
reading data from the SRAM bit-cell to the first bit-line through the first access element; and
writing the data from one of the second bit-lines into the non-volatile bit-cell through the respective one of the pair of second transistors.

14. The method according to claim 13, wherein, for the writing into the non-volatile bit-cell:
the reading of the data from the SRAM bit-cell and the writing of the data into the non-volatile bit-cell, respectively, is performed one after the other in a same clock cycle.

15. The method according to claim 13, wherein writing into a plurality of non-volatile bit-cells is performed word-line by word-line.

16. The method according to claim 13, wherein the method further comprises, for reading data from the non-volatile bit-cell into the SRAM bit-cell:
enabling switching between the non-volatile bit-cell and the SRAM bit-cell; and
ramping-up a restore voltage applied to the non-volatile bit-cell or ramping-up a supply voltage applied to the SRAM bit-cell.

17. The NV-SRAM device according to claim 1, wherein the device is configured to linearly ramp up the second restore-line to a restore voltage.

* * * * *

UNITED STATES PATENT AND TRADEMARK OFFICE
CERTIFICATE OF CORRECTION

| | | |
|---|---|---|
| PATENT NO. | : 11,900,987 B2 | Page 1 of 1 |
| APPLICATION NO. | : 16/951919 | |
| DATED | : February 13, 2024 | |
| INVENTOR(S) | : Mohit Gupta | |

It is certified that error appears in the above-identified patent and that said Letters Patent is hereby corrected as shown below:

On the Title Page

In the Title in Column 1, after "MEMORY" insert -- DEVICE --.

In the Specification

At Column 1, Line 2, after "MEMORY" insert -- DEVICE --.

Signed and Sealed this
Twenty-first Day of May, 2024

*Katherine Kelly Vidal*

Katherine Kelly Vidal
*Director of the United States Patent and Trademark Office*